United States Patent [19]
Pohm

[11] Patent Number: 5,768,180
[45] Date of Patent: Jun. 16, 1998

[54] MAGNETORESISTIVE MEMORY USING LARGE FRACTIONS OF MEMORY CELL FILMS FOR DATA STORAGE

[75] Inventor: Arthur V. Pohm, Ames, Iowa

[73] Assignee: Nonvolatile Electronics, Incorporated, Eden Prairie, Minn.

[21] Appl. No.: 789,284

[22] Filed: Jan. 28, 1997

Related U.S. Application Data

[62] Division of Ser. No. 369,098, Jan. 5, 1995, Pat. No. 5,636,159, which is a division of Ser. No. 950,921, Sep. 24, 1992, Pat. No. 5,420,819.

[51] Int. Cl.⁶ .................................................. G11C 11/15
[52] U.S. Cl. ........................ 365/158; 365/173; 365/171
[58] Field of Search ............................. 365/158, 171, 365/173

[56] References Cited

U.S. PATENT DOCUMENTS

| | | | |
|---|---|---|---|
| 4,731,757 | 3/1988 | Daughton et al. | 365/173 |
| 4,754,431 | 6/1988 | Jenson | 365/158 |
| 4,780,848 | 10/1988 | Daughton et al. | 365/173 |
| 4,829,476 | 5/1989 | Dupuis et al. | 365/158 |
| 4,857,418 | 8/1989 | Schuetz | 428/693 |
| 4,897,288 | 1/1990 | Jenson | 427/123 |
| 4,918,655 | 4/1990 | Daughton | 365/173 |
| 4,945,397 | 7/1990 | Schuetz | 257/421 |
| 5,012,444 | 4/1991 | Hurst, Jr. et al. | 365/173 |
| 5,251,170 | 10/1993 | Daughton et al. | 365/158 |

FOREIGN PATENT DOCUMENTS

| | | | |
|---|---|---|---|
| 0507451 | 10/1992 | European Pat. Off. | 365/158 |

*Primary Examiner*—David C. Nelms
*Assistant Examiner*—Andrew Q. Tran
*Attorney, Agent, or Firm*—Kinney & Lange, P.A.

[57] ABSTRACT

A digital memory having a plurality of locations where selectively coincident currents can be selected to flow in a pair of wordline structures, or with a wordline structure paired with a composite line structure (and possibly a bit line structure), to continue an existing, or switch to an opposite, edge magnetization state in a composite line structure or, alternatively, continue or switch a magnetization state in a storage film cell used to magnetically bias such a composite line structure.

22 Claims, 10 Drawing Sheets

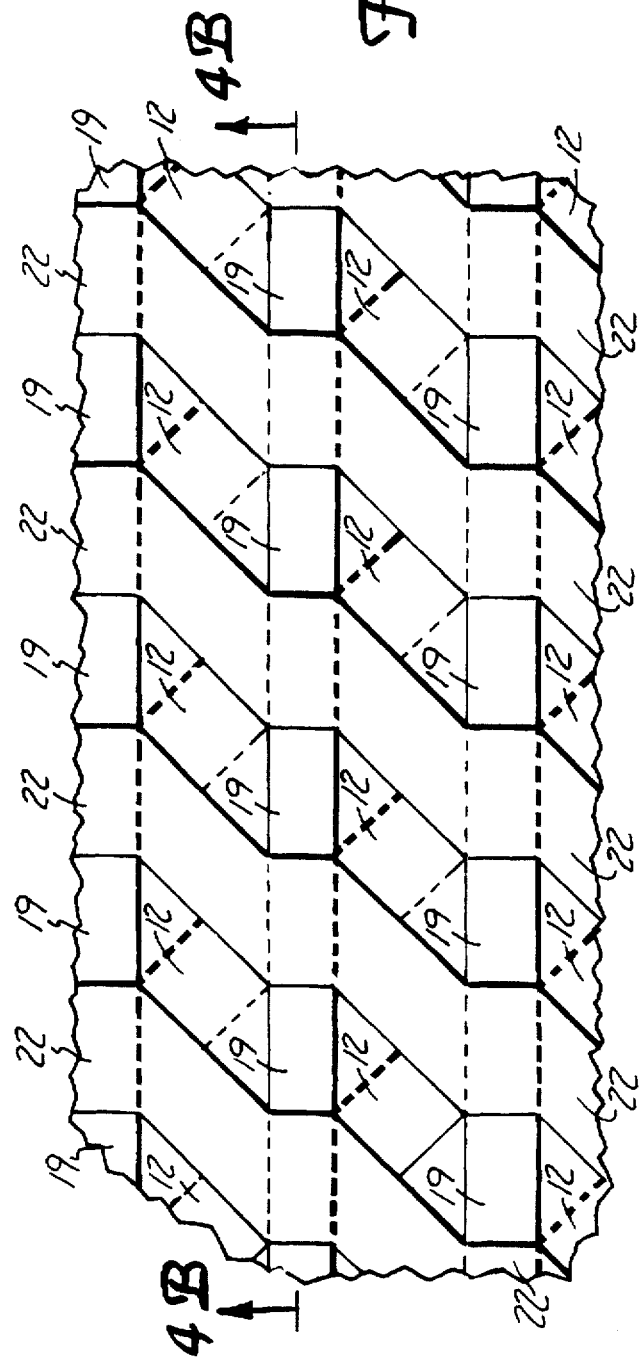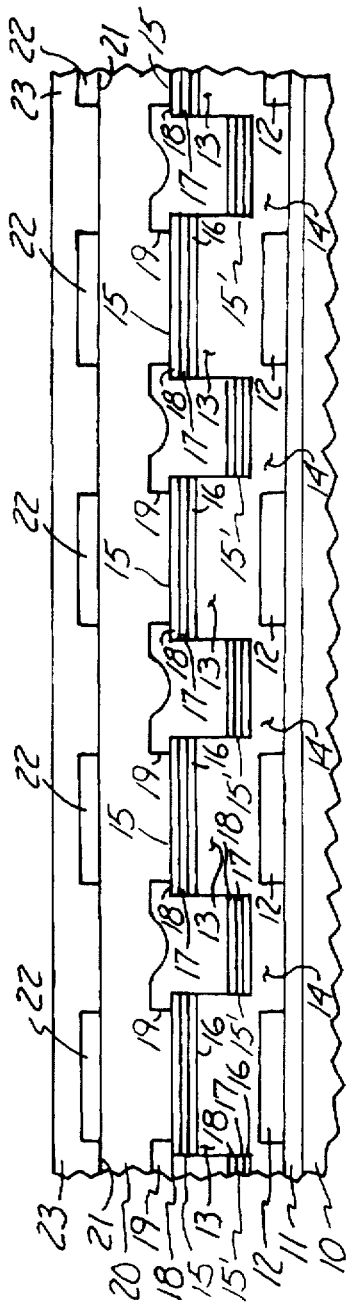
Fig. 4A
Fig. 4B

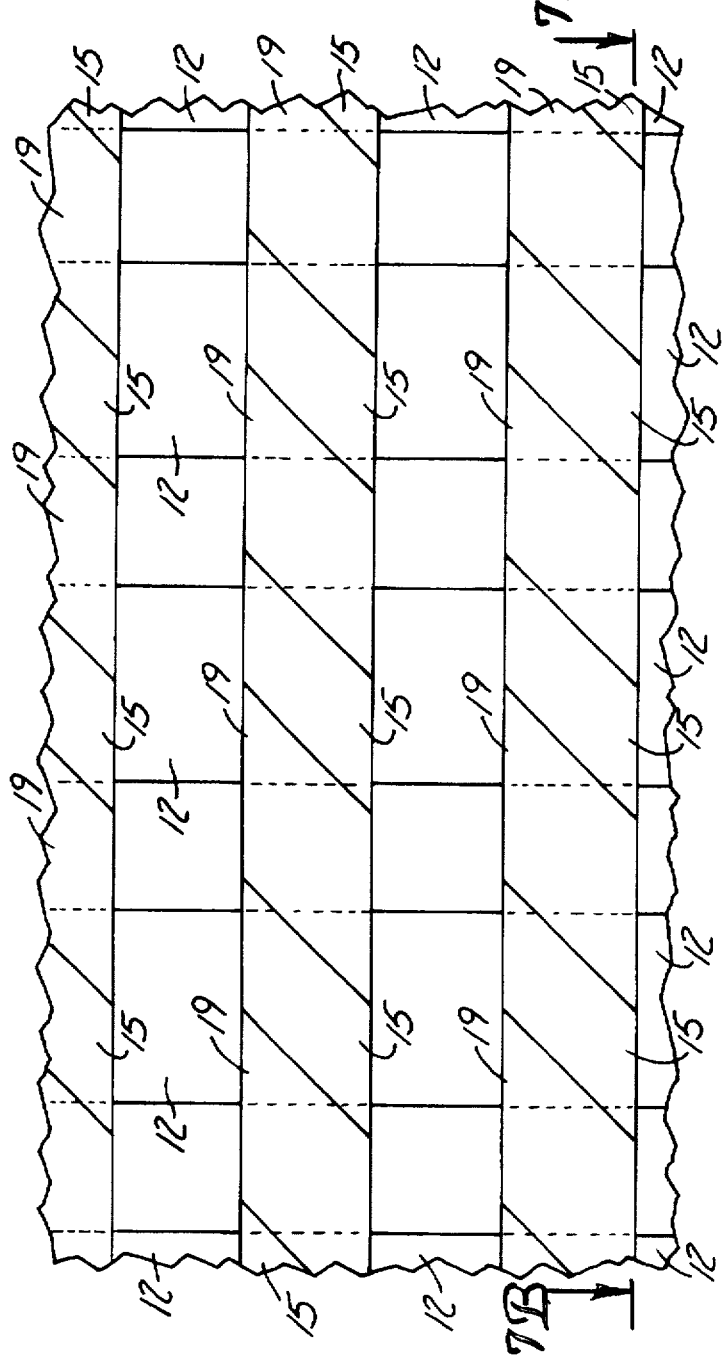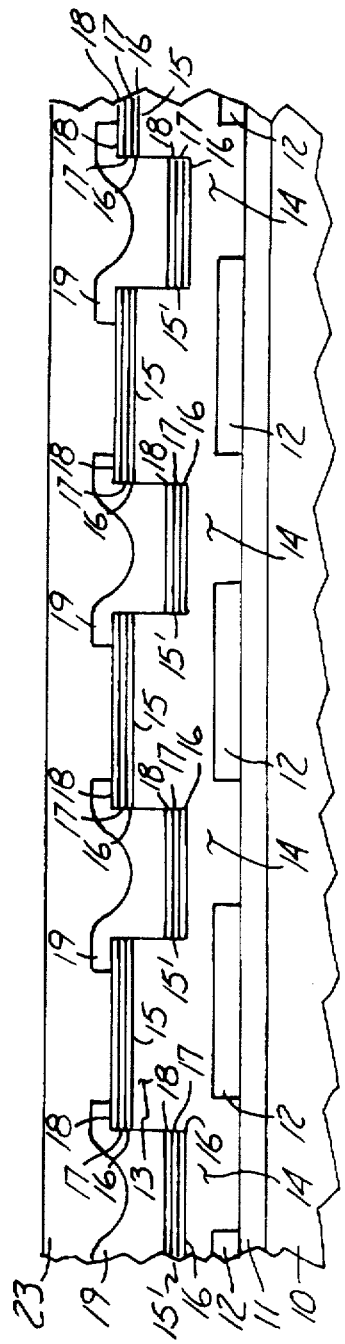
Fig. 7A
Fig. 7B

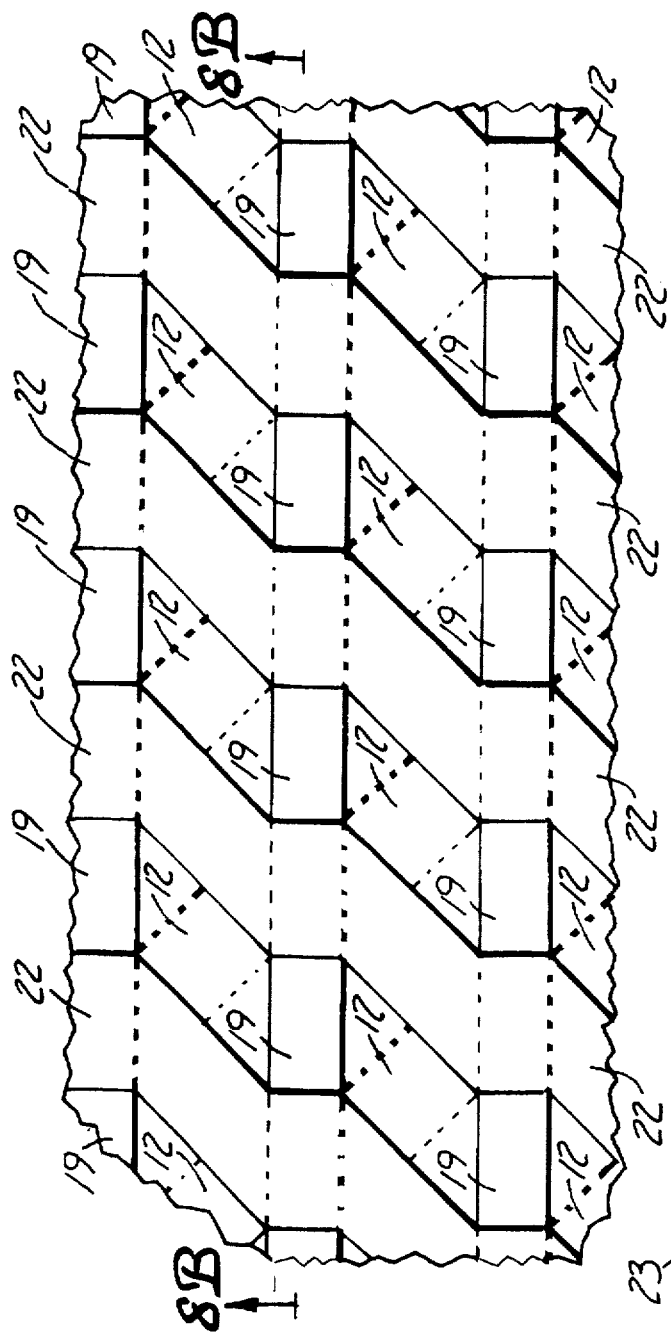
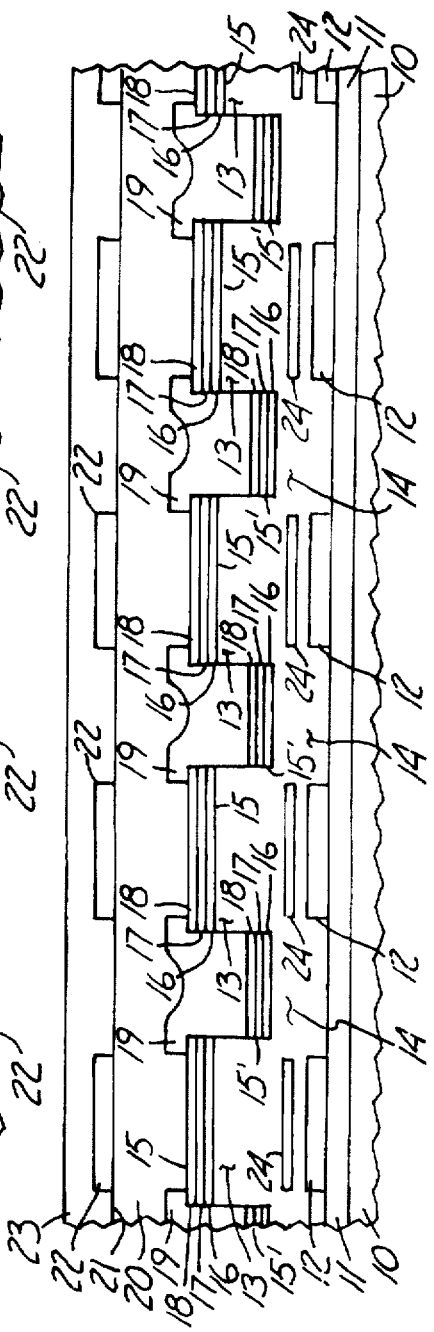
Fig. 8A
Fig. 8B

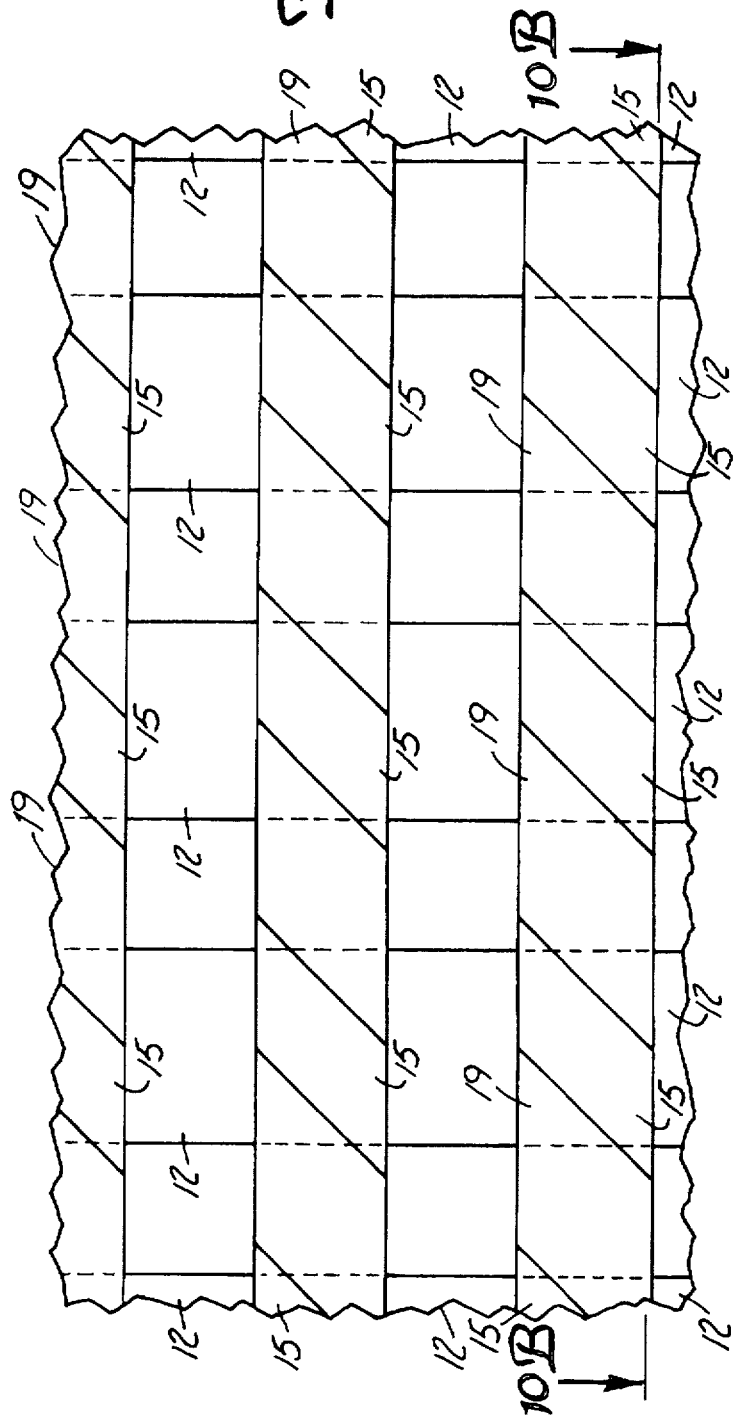
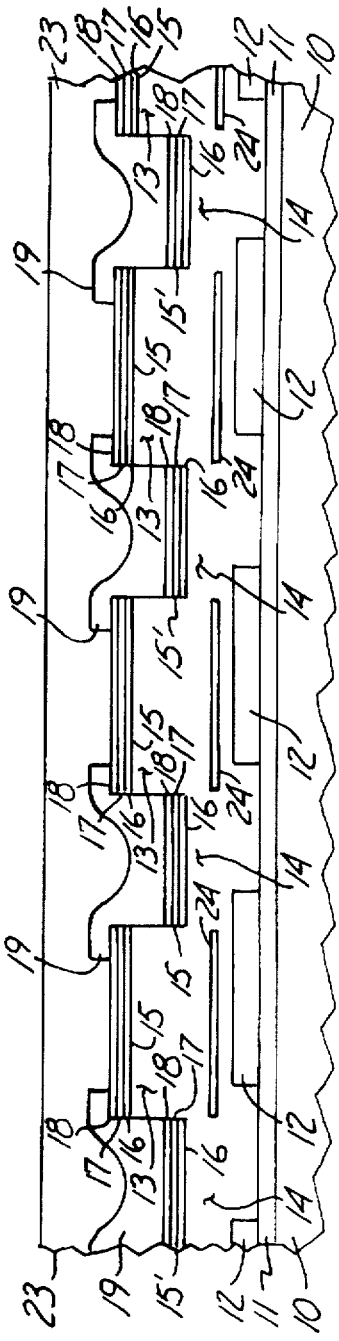

MAGNETORESISTIVE MEMORY USING LARGE FRACTIONS OF MEMORY CELL FILMS FOR DATA STORAGE This is a division of application Ser. No. 08/369,098, filed Jan. 5, 1995, now U.S. Pat No. 5,636,159, which is a division of application Ser. No. 07/950,921, filed Sep. 24, 1992, now U.S. Pat. 5,420,819.

BACKGROUND OF THE INVENTION

The present invention relates to ferromagnetic thin-film memories and, more particularly, to ferromagnetic thin-film memory cells in which information states of memory cells therein are determined through magnetoresistive properties of the thin-film cells.

Digital memories are used extensively in digital systems of many kinds including computers and computer system components, and digital signal processing system. Such memories can be advantageously based on the storage of digital bits as alternative states of magnetization in magnetic materials in each memory cell, particularly thin-film magnetic materials, resulting in memories which use less electrical power and do not lose information upon removals of such electrical power.

These memories may use ferromagnetic thin-film materials in the memory cells through which access to the information stored therein can be provided by either inductive sensing to determine the magnetization state, or by magnetoresistive sensing to make such a determination, sufficiently small memory cell sizes favoring magnetoresistive sensing because significantly more output signal is available. Such ferromagnetic thin-film memories may be provided on a surface of a monolithic integrated circuit to provide convenient electrical interconnections between the memory cells and the memory operating circuitry.

Ferromagnetic thin-film memory cells can be made very small and packed very closely together to achieve a significant density of information being stored, particularly when provided on a surface in a monolithic integrated circuit. The magnetic environment can become quite complex with fields in any one memory cell affecting the film portions in neighboring memory cells. Also, small ferromagnetic film portions in a memory cell can lead to substantial demagnetization fields which can cause instabilities in the magnetization state desired in such a cell as will be further described below.

These magnetic effects between neighbors in an array of closely packed ferromagnetic thin film memory cells can be ameliorated to a considerable extent by providing a memory cell based on a bit structure with an intermediate separating material having two major surfaces on each of which an anisotropic ferromagnetic memory thin-film is provided. Such an arrangement provides a significant "flux closure", i. e. a more closely confined magnetic flux path, to thereby confine the magnetic field arising in a cell to affecting primarily just that cell. This is considerably enhanced by choosing the separating material in the ferromagnetic thin-film memory cells to each be sufficiently thin.

Often such a digital memory is constructed by having a number of bit structures connected in series at junctures to one another in an end-to-end fashion to form a sense line current path. A series of current straps, or wordlines, are often provided in an orthogonal layout to a series of connected bit structures, or sense lines, so that a strap crosses each of the bit structures between the junctures connected thereto. In a magnetoresistive memory, such straps or wordlines are used both in the entering of, and the sensing of, information in the bit structures. This can be done by using currents in the wordlines for setting, or for determining the existing, magnetization state of bit structures storing bits of digital information each in a cell in the memory. Examples of such devices are described in more detail in U.S. Pat. Nos. 4,731,757 to Daughton et al and 4,780,848 to Daughton et al, both of which are hereby incorporated herein by reference, and in an earlier filed co-pending application by J. M. Daughton and A. V. Pohm entitled "Offset Magnetoresistive Memory Structures" having Ser. No. 07/786,128, and now U.S. Pat. No. 5,251,170, also hereby incorporated herein by reference.

The ferromagnetic thin-film in a memory cell, most often formed as two film portions on either side of the intermediate layer, is typically formed of an alloy of nickel, cobalt and iron in proportions of approximately 60%, 20% and 20%, respectively. Usually, these proportions are chosen to strongly reduce or eliminate any magnetostrictive effects in the film, and to improve certain other properties of the film for its intended use. In some situations, other materials are added to the alloy in relatively small amounts to improve certain properties of the film.

Such films can be fabricated by vacuum deposition or other methods and, if done in the presence of a magnetic field oriented in a selected direction, the resulting ferromagnetic thin-film will exhibit uniaxial anisotropy with the easy axis parallel to the direction in which the magnetic field is oriented during fabrication (which is typically such as to be parallel to the device wordline and so perpendicular to the path taken by the end-to-end bit structures forming a sense line). Because very large demagnetization fields would otherwise result, the magnetization vector of such a film will always lie in a plane of the film.

Furthermore, in accord with thermodynamics, the magnetization in such a film will arrange itself to minimize the magnetic energy therein. In the absence of any externally applied magnetic fields, such minimization occurs when the magnetization vector of a film portion parallels the easy axis of the film portion pointing in either direction along such axis.

However, the situation of such a film portion changes in the presence of externally applied magnetic fields and the minimization of magnetic energy may then occur with the magnetization vector of the film oriented at an angle with respect to the easy axis. As long as the magnetization of the film portion is in a single domain state, the magnetization vector can be caused to rotate with respect to the easy axis to reach angles determined by the externally applied fields, and this can occur without substantially affecting the magnitude of the magnetization.

Such ferromagnetic thin-films as those just described as the memory film portions on either side of the intermediate layer in a bit structure further exhibit magnetoresistance. Differences in direction between that of the magnetization vector in the memory film, and that of a current passed through the film, leads to differences in the effective electrical resistance in the direction of the current. The maximum electrical resistance occurs when the magnetization vector in the film and the current direction are parallel to one another, while the minimum resistance occurs when they are perpendicular to one another. Electrical resistance of such a magnetoresistive memory film can be shown to be given by a constant value, representing the minimum resistance, plus an additional value depending on the angle between the current direction in the film and the magnetization vector therein. This additional resistance follows a square of the cosine of that angle.

As a result, external magnetic fields can be used to vary the angle of the magnetization vector in such a film portion with respect to the easy axis of the film, and can vary it to such an extent as to cause switching the magnetization vector between two stable states which occur as magnetizations in opposite directions along the easy axis. Further, the state of the magnetization vector in such a film portion can be measured or sensed by the change in resistance encountered by current directed through this film portion. This provides the basis for a memory film portion to serve as part of a bit structure in a memory cell, the state of which is subject to being determined by effects occurring in currents applied to this portion. U.S. Pat. Nos. 4,829,476 to DuPuis et al and 5,012,444 to Hurst et al describe devices using such magnetoresistive sensing and are hereby incorporated herein by reference.

Although the two states in which the magnetization vector can occur in the bit structure ferromagnetic thin-films in the absence of external magnetic fields, i.e. the film magnetization being oriented in one of two directions along the film easy, axis were described as stable in the foregoing paragraph, such stability can be lost as the size of the memory cell, or the bit structure forming that memory cell, is decreased. This potential loss of stability comes about because the film magnetization is subject to being altered in direction from either of the two expected directions along the bit structure ferromagnetic thin-film easy axis even though no significant external magnetic fields are present. Such a situation in the film material can lead to the magnetization in some portions thereof being at an angle with respect to the easy axis, even the point of being perpendicular thereto, or oriented even a greater angle than 90° thereto.

The primary such magnetic effect in the magnetoresistive, anisotropic ferromagnetic thin-films used in the memory cell bit structures is known as "curling" and results from the presence of large demagnetization fields in the bit structure memory film. The upper one of the two such memory film portions for a typical bit structure is shown in representational form in FIG. 1, and has shown thereon arrows giving the direction of the magnetization of that film at the locations at which those arrows begin. The easy axis in the presentation is oriented vertically in FIG. 1 and so substantially parallels the magnetizations occurring at the center of the film.

However, because of the relative closeness of the top and bottom edges of the film in FIG. 1, the demagnetizing fields due to "free poles" occurring along those edges are quite high and lead to reorienting the magnetization near those edges where the demagnetizing fields are the greatest, i.e. "curling" results. That is, the electron spins of the film material atoms at the top and bottom edges of the films are constrained to lie nearly parallel to these edges in the direction of elongation of the film portion, and so nearly parallel to the film hard axis, or nearly perpendicular to the film easy axis. This orientation results in minimizing the magnetic energy in the film due to the presence of both the demagnetization field and the anisotropy field which is a measure of the strength of the preference of the film material for the magnetization being along the easy axis.

The directions of the film material atoms electron spins, or the film magnetization, only gradually turn to parallel the film easy axis as the interior of the film portion is approached since the demagnetizing field decreases toward the film interior to the point of being more and more overcome by the anisotropy field. Thus, the magnetization component along the easy axis of the film portion in FIG. 1 has a value near zero at the upper and lower edges in FIG. 1 where the wordline over the bit structure would cross those edges, and gradually this easy axis magnetization component increases toward the interior of the film portion. In those interior regions of the film, beginning from near the upper and lower edges and extending to the film center, the easy axis magnetization component value increases toward the saturation value of the film material and reaches that value toward the film center in a single magnetic domain situation.

As can be seen, such magnetoresistive, anisotropic ferromagnetic thin-films, having their easy axis extending in a direction parallel to the wordline and perpendicular to the direction of elongation of the film, do not really saturate across the film along the easy axis, but only saturate across a portion of the film in the interior thereof. Further, while external magnetic fields may cause the magnetization of the interior portions to switch between opposite states along the easy axis, such switching will not have much effect on the magnetization of the portions near the upper and lower edges of the film portion in FIG. 1 because of the strength of the demagnetizing fields unless impractically large external magnetic fields are used in the switching arrangement described in the earlier cited U.S. Pat. Nos. 4,829,476 and 5,012,444 with conventional cell structure materials. Hence, the change in resistance measured by an electrical current along the direction of elongation of the film portion will not have a contribution to it from the upper and lower edge portions of the film of FIG. 1. This means there will be a smaller resistance than otherwise would be possible from a film portion of that size, and so a smaller output signal from the memory cell using such a film portion to indicate its magnetization state, and so the value of the digital bits stored therein. The switching arrangements of the last mentioned patents typically yield output signals based on only five to 35 percent of the possible magnetoresistive effect in a film portion of a memory cell.

The distance from the upper and lower edges of the film portion in FIG. 1 to the points where the film magnetization direction is more or less parallel to the easy axis, or its natural lowest energy direction in the absence of external magnetic fields, is found by minimizing the magnetic energy in the film. This includes the anisotropy energy, the exchange energy and the demagnetization energy. The anisotropy energy is minimized by a rapid return along this distance of the magnetization to being parallel with the easy axis. The exchange energy, determined from quantum mechanics and based on the change of angle between adjacent atoms magnetic spin, is minimized by having the adjacent electron spins parallel with one another and so tends toward having the magnetization parallel the easy axis along this distance but relatively weakly. The demagnetizing energy does not change very significantly with changes in the local magnetization, and so distances from the edges to the points where the magnetization parallels the easy axis is primarily determined from jointly minimizing the anisotropy and exchange energies. Such distances are denominated as "curling distances."

Reducing the size of the memory film portion in order to construct memories having larger numbers of memory cells therein by increasing the surface density of such cells will further reduce the output signal from individual memory cells on the surface using the sensing methods of U.S. Pat. Nos. 4,829,476 and 5,012,444. This follows because any closer approach of the upper and lower edges tends to strengthen the magnetizing field due to the free poles therealong so that the "curled portions" near the edges remain with the magnetization thereof being urged toward being parallel to those edges over more or less the same "curling distances" in the film of smaller cells as it is in larger cells. Thus, the memory cell bit structure output signal generating portions, the film interior portions, effectively suffer the primary size reduction as the overall film surface dimensions are reduced in a memory cell.

Clearly, this output signal loss cannot be taken too far if an output signal is to be obtained from the memory cell portion that is sufficient to indicate the magnetization state therein with respect to the easy axis, and so minimum memory cell dimensions must be observed in these circumstances if an output signal of sufficient magnitude is to be obtained. Otherwise, if the cell size reduction is taken too far, there will be no portions of the film magnetization which would parallel the easy axis thereof, and so there will not be a pair of stable states along the easy axis for the magnetization to be switched between by external magnetic fields. Such result is shown in FIG. 2 where any vertical, or easy axis, magnetization component anywhere in the film portion is relatively quite small. Hence, a magnetization state switching and sensing arrangement is desired which will provide sufficiently greater memory cell output signals to indicate magnetization states occurring therein to permit use of a memory cell structure having reduced dimensions to increase the memory system digital bit, or stored information, density.

SUMMARY OF THE INVENTION

The present invention provides a digital memory having a plurality of locations where selectively coincident currents can be selected to flow in a pair of wordline structures, or with a wordline structure paired with a composite line structure (and possibly a bit line structure), to continue an existing, or switch to an opposite, magnetization state in a composite line structure or, alternatively, in a storage film cell used to magnetically bias such a composite line structure. Selections of such coincident currents are made to continue existing, or switch to opposite, edge magnetization states of such composite line structures or storage film cells. A composite line structure can be formed of a plurality of electrically connected bit structures where the bit structures are based on having an intermediate separating material with two major surfaces on either of which an anisotropic ferromagnetic memory film exhibiting magnetoresistance is provided.

BRIEF DESCRIPTION OF THE DRAWINGS

FIGS. 4A and 4B are diagrammatic representations of a portion of a device embodying the present invention.

FIGS. 7A and 7B are diagrammatic representations of a portion of a device embodying the present invention.

FIGS. 8A and 8B are diagrammatic representations of a portion of the device embodying the present invention.

FIGS. 10A and 10B are diagrammatic representations of a portion of a device embodying the present invention.

DETAILED DESCRIPTION OF THE PREFERRED EMBODIMENTS

Figure 1:
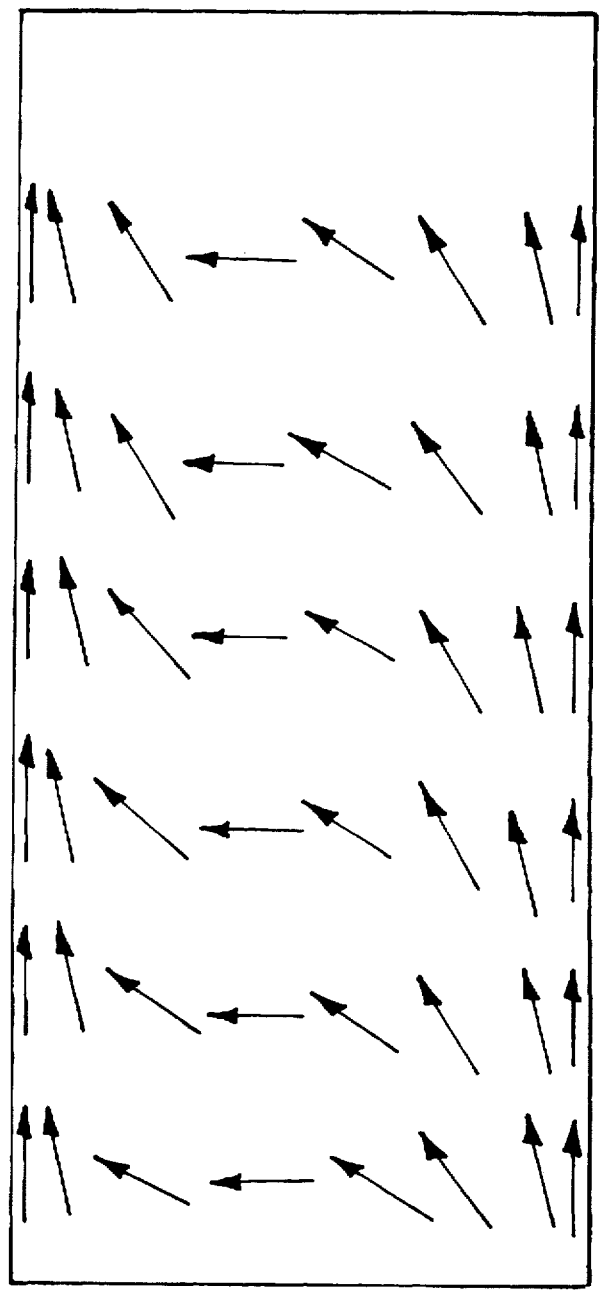
FIG. 1 is a diagram representing a cell film.
Figure 2:
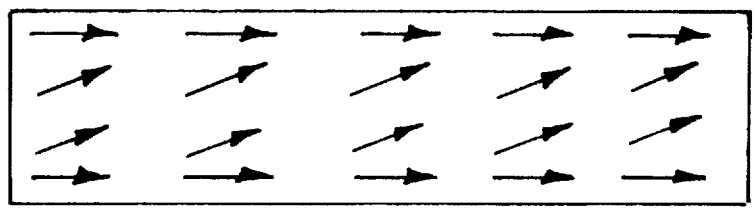
FIG. 2 is a diagram representing a cell film.

Because the reduction in size of bit structures leads to less of a memory cell magnetization being parallel to the easy axis provided in that bit structure (parallel to the short side of the rectangle as shown in FIG. 2), there is a corresponding reduction in the output signal from the cell obtained following the methods used in U.S. Pat. Nos. 4,829,476 and 5,012,444 incorporated above. Such an output signal is obtained by switching the interior magnetization of the cell from being somewhat parallel to one direction along which the cell easy axis extends to being somewhat parallel to the opposite direction of extent of the cell easy axis.

Yet, such a reduction in bit structure size for a memory cell is required to permit obtaining the necessary bit structure density across the substrate therefor, provided by a monolithic integrated circuit, if the resulting semiconductor memories are to be competitive in the markets therefor. To reach this goal, the reduction in the size of a bit structure for a memory cell has been found possible to be carried to a point where switching the edge magnetizations of the structure between opposite directions more or less perpendicular to the easy axis becomes feasible. That is, bit structures can be provided for memory cells small enough to permit supplying enough current thereby to make practical the development of magnetic fields sufficiently intense to switch edge magnetizations of the bit structures between the opposite directions along the extent of the long dimensions of the bit structures. Thus, information in the digital form of "1" and "0" magnetization states can be kept on the basis of which way the edge magnetization points with respect to the opposite directions of the extent of the long dimension of the bit structure or, in the situation of the bit structure of FIG. 2, with respect to which way the edge magnetization in the plane of the structure is perpendicular relative to the easy axis of the structure.

Such an edge magnetization information storage arrangement does not have a significantly smaller fraction of the bit structure surface devoted to storing information as the bit structure dimensions shrink as do the previous arrangements relying on the magnetization of an interior portion of the bit structure being aligned in one direction or another with the easy axis. Rather, as the bit structure dimensions shrink, the magnetization of the entire structure will at some point become a single magnetic domain without interior domain walls so that the magnetization of the entirety of the structure will point in one direction or the other substantially parallel to the longest edge dimension. Thus, edge magnetization information storage (or entire structure magnetization information storage at some sufficiently small dimension) will be increasingly stable with shrinking bit structure dimensions, and will, if anything as the bit structure size diminishes, have an increasing cell surface fraction with its associated magnetization oriented in a direction consistent with the information stored therein.

In this cell edge magnetization information storage arrangement, the easy axis of the bit structure used in the memory cells continues to be formed, during fabrication, parallel to the short dimension of the bit structure. This permits the edge magnetizations thereof to be switched between opposite directions substantially parallel to the long dimension of the bit structure with magnetic fields of a sufficiently small magnitude so that current levels in the conductors used to control such switching can be kept at reasonable values for the conductor structures available to be used.

Figure 3A:
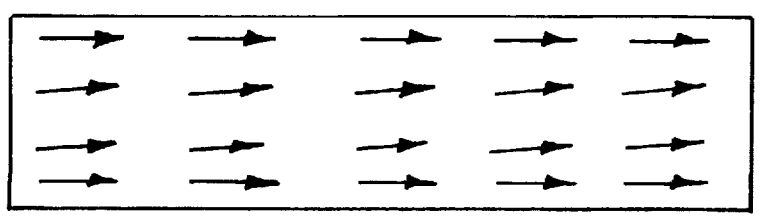
FIGS. 3A and 3B are diagrams representing cell films.

Similar benefits of this easy axis orientation are provided for the retrieval of information previously stored in memory cells using edge magnetizations of bit structures therein. A retrieval magnetic field is established for this purpose parallel to the long dimension of the bit structure, and such an applied field must be either oriented substantially in the same direction as the edge magnetization of the structure before application of the field or oriented in substantially the opposite direction. If that retrieval field applied to the cell bit structure is oriented in substantially the same direction as the edge magnetization before application of this field as shown in FIG. 2, the applied field will have the effect of only further aligning magnetization of the interior portions to be more parallel with the direction of the magnetization of the edge portions as shown in FIG. 3A. Thus, there would be a slight increase in electrical resistance through the long direction of the bit structure shown in FIG. 3A, after application of the retrieval magnetic field, beyond the value the cell resistance had in FIG. 2, representing the situation prior to the application of the magnetic field. This occurs because the application of this magnetic field substantially increases the parallelism of the interior regions magnetization and the edge regions magnetization over that of the structure shown in FIG. 2.

Figure 3B:
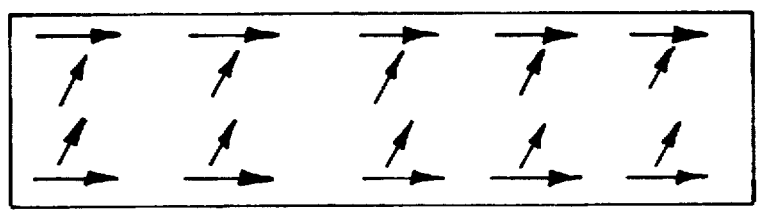

In the opposite situation, the application of & retrieval magnetic field which is oriented opposite to the direction of the edge magnetizations shown in FIG. 2, representing the situation prior to the application of the retrieval field, will result in the magnetization of a substantial fraction of the interior portions of the bit structure being forced to more closely align with the bit structure easy axis and so be more perpendicular to the applied retrieval field, this result being shown in FIG. 3B. (In both FIGS. 2 and 3B, the interior regions magnetizations were assumed to be partially aligned with the easy axis with the aligned component pointing upward in those figures. Alternatively, the interior portion magnetization could just as well have been presented with the vertical component pointing downward. Typically, the bit structures will have one direction or the other set in by the combination of a sense line current along with the word line current as will be more clearly understood after what follows below.) As can be seen in FIG. 3B, a very large fraction of the surface of the bit structure in that figure has the associated magnetization thereof made more parallel to the easy axis through supplying a sufficiently large magnetic field perpendicular to the edge magnetizations so that only a relatively small portion of the edge magnetizations are locked into being parallel with the long dimension of the bit structure when compared to the magnetization shown in FIG. 2. As a result, a much greater resistance change as a fraction of the total cell long direction resistance, compared to the previous situation for an oppositely oriented retrieval field described just above, can be obtained (a decrease). Such a larger resistance change gives a significantly larger output signal in response to a sense current through the cell compared to the previous situation output signal.

The results described in these two situations for edge magnetization information storage retrieval are obtained without relying on a sense line current being present of a sufficiently large magnitude to provide a magnetic field having a substantial effect on the magnetizations in the interior regions of the bit structure as was required with the earlier methods based on determining the direction of magnetization of these interior regions. On the other hand, as will be seen below, the use of such sense line currents in aid of retrieving information in the edge magnetization information storage arrangement can be advantageous in reducing the number of structural features needed in a direction perpendicular to the surface of the bit structure to thereby reduce the number of bit structure fabrication steps.

One monolithic integrated circuit structure arrangement in which such bit structures are formed permitting the use of an edge magnetization information storage arrangement is shown in FIGS. 4A and 4B. These figures, and those following, are not to scale and are not in proportion for purposes of clarity. Further, again for clarity, some of the structural features shown in FIG. 4B are omitted or abbreviated in FIG. 4B. Some of the fabrication steps resulting in the structures in these figures and the following are more fully described in U.S. Pat. Nos. 4,754,431 to Jensen, 4,857,418 to Schuetz, 4,897,288 to Jensen, 4,918,655 to Daughton, and 4,945,397 to Schuetz, which are hereby incorporated herein by reference, and in U.S. Pat. No. 5,251,170, earlier incorporated herein by reference.

A monolithic integrated circuit as a substrate, 10, shown in FIG. 4B, is used both as a support for the memory structures arrayed thereon and as the source of much of the operating circuitry for these structures. An electrically insulative layer, 11, is used to prevent undesired electrical contact between monolithic integrated circuit substrate 10 and the memory structures thereabove as shown in FIG. 4B. Insulative layer 11 is formed as a composite layer on substrate 10 with the bottom fraction thereof formed of silicon dioxide, typically from 2,000 to 6,000 Å thick. The upper fraction thereof is formed of silicon nitride which is typically from 100 to 1,000 Å. Both fractions of layer 11 are typically provided using sputter deposition.

A lower set of wordlines, 12, are provided on the upper surface of layer 11 and shown in both FIGS. 4B and 4A, though only in part in FIG. 4A. Wordlines 12 are typically formed of aluminum alloyed with 4% copper and typically by sputter deposition to a thickness of 1,000 to 10,000 Å.

A further composite insulative layer is thereafter formed over lower wordlines 12 with a lower layer portion being of silicon dioxide provided by sputter deposition to a depth of 1,000 Å over lower wordlines 12. The upper fraction of this composite insulative layer is formed, again as in the previous composite layer, of silicon nitride to a depth of 1,000 Å by sputter deposition. This composite layer provision is followed by etching through the nitride upper fraction of thereof by reactive ion etching to reach the dioxide lower fraction thereof serving as an etching stop. Such etching leads to this second composite insulative layer having elevated portions, 13, at the top surface of the remaining portions of the nitride upper fraction thereof, and depressed portions, 14, where the dioxide lower fraction is exposed as shown in FIG. 4B.

Thereafter, composite magnetic structures are formed as bit structures, 15, on the upper surfaces of elevated portions 13, and as connecting portions, 15', on depressed surfaces 14 to result in adjacent ones of these composite magnetic structures being vertically offset from one another as shown in FIG. 4B. Thus, the thickness of the nitride upper fraction of the second composite layer is determinative of the offset distances which will result between adjacent structures, and will always be chosen so that the resulting offset distance is at least twice the thickness of the intermediate layer between the ferromagnetic memory thin-film layers in that composite magnetic structure as will be described below. Alternatively, the composite magnetic structures could be formed without any offsets between adjacent portions, i.e. as a "straight through" continuously connected body on a single surface, uniform insulating layer so that they would each appear to be a set of horizontal lines without breaks in a FIG. 4B type cross section view therethrough.

The formation of the composite magnetic structures for bit structure 12 will be done first by sputter depositing a layer of silicon nitride typically 100 to 500 Å thick (the result of which is not shown in FIG. 4B) over surfaces 13 and 14 so that all surfaces to receive the next deposition are surfaces formed of silicon nitride. The sides of the openings between surfaces 13 and 14 are formed to be quite steep and, if sufficiently close to vertical, there will be relatively little material deposited thereon, perhaps essentially none, in the various stages in forming the composite magnetic structures to serve as bit structures 15. Otherwise, ion milling at a relatively small angle above the plane of the surfaces 13, typically 20°, must be used to remove material preferentially from the sides of these openings to be certain that no magnetic structure material remains between adjacent bit structures and the connecting structures. Such unwanted material would cause the very flux closure between adjacent devices that is to be avoided by the offsets. Hence, the resulting composite magnetic structures are shown without any material on the sides of the opening as must be achieved at least with respect to the magnetic materials in such structures.

Sputter deposition (in the presence of an easy axis orientation magnetic field directed into the plane of the paper in FIG. 4B) is used to next provide a magnetoresistive, anisotropic ferromagnetic thin-film memory layer on the silicon nitride layer. This layer is typically formed of 60% nickel, 20% cobalt and 20% iron, and is formed to a thickness of typically 100 to 200 Å. Ion milling is used to form this ferromagnetic thin-film layer into memory film portions, 16, one for each of the bit structures being fabricated on elevated surfaces 13 and one in each of the connecting structures on depressed surfaces 14. An intermediate layer is then formed by sputter deposition of typically tantalum nitride to a typical thickness of 30 to 70 Å, this layer then being reactively ion etched to yield portions, 17, thereof each confined in its major surface to dimensions approximately the same as the major surface dimensions of film portions 16 thereunder.

Another magnetoresistive, anisotropic ferromagnetic thin film memory layer is again sputter deposited, as above, and ion milled to provide second ferromagnetic memory thin-film portions, 18, each having major surface dimensions similar to those of the major surface portions 16 and 17 thereunder, the thickness and composition of film portions 18 being approximately those of film portions 16. Finally, a layer of typically tantalum nitride is sputter deposited to a typical thickness of 50 to 300 Å, and reactive ion etching is again used to provide that layer with major surface portions approximately the same as those of layers 16, 17 and 18 forming bit structures 15 and connecting structures 15' thereunder, this last layer again not being shown in FIG. 4B. The portions of this last layer are electrical insulators and used to passivate the surfaces of ferromagnetic thin-film memory portions 18. The major surface dimensions of layer portions 16, 17 and 18 are typically on the order of 0.5 µm in the short direction and 1.0 µm in the long direction for each bit structure 15.

A layer, typically of tungsten, is then sputter deposited over the composite magnetic structures 15 and the connecting structures 15' to a typical thickness of 1.000 to 6.000 Å, and reactive ion etching of this tungsten layer is performed on those portions thereof not over connecting structures 15'. As a result, connecting portions 15' above depressed surfaces 14 are covered by corresponding tungsten layer remnants, 19, which lap over onto each of the bit structures 15 adjacent thereto. Connecting structures 15' are thus electrically shorted out and the adjacent bit structures are electrically connected in series to one another so that tungsten remnants 19 form the bit junctures between adjacent bit structures 15 thereby forming those bit structures into a single electrical conductor formed as a horizontal row in FIG. 4A, i.e. an electrically continuous sense line.

In other words, tungsten layer remnants 19 below, and at either end of, each of bit structures 15, being used to store digital information, provide the electrical interconnections between such bit structures. The sense line resulting from these interconnections can conduct a sense current which passes through tungsten layer remnants 19, and over the adjacent connecting structures 15' formed on depressed portions 14, to also pass through adjacent bit structures 15 formed on elevated portions 13. Thus, every other composite magnetic structure, those above insulative elevated surfaces 13, is used to store digital information and is connected in series with a plurality of others interconnected by tungsten layer remnants 19 to form a sense line serving as a state determination line for determining magnetic states of bit structures 15 therein.

Thereafter, an insulating layer, 20, of typically silicon dioxide is formed over bit structures 15 and bit junctures 19 through the use of sputter deposition to a typical thickness of 2,000 to 6,000 Å. On the resulting upper surface, 21, thereof, layer 20 has formed thereon a set of upper wordlines, 22, positioned in part over bit structures 15 formed on elevated insulative surfaces 13. Upper wordlines 22 are formed of typically aluminum alloyed with 4% copper through use of sputter deposition to a typical thickness of 1,000 to 10,000 Å.

As a result, one lower wordline 12 and one upper wordline 22 are present below and above, respectively, each bit structure 15, there being a unique combination of a lower wordline 12 and a upper wordline 22 below and above each bit structure 15 as can be seen by the pattern thereof shown in FIG. 4A. Thus, a combined magnetic field due to the combining of the magnetic fields resulting from currents both in a corresponding lower wordline and a corresponding upper wordline can be provided in a selected one of bit structures 15. The other remaining bit structures 15 simultaneously have either a magnetic field therein equal to that provided only by the current through just one or the other of the upper wordline and lower wordline involved, or no directly provided magnetic field from either wordline passing adjacent thereto. Hence, a single bit structure 15 can be selected to have a magnetic field provided therein due to currents in the corresponding lower and upper wordlines great enough to cause the edge magnetizations therein to switch direction, while leaving the edge magnetizations of other bit structures along those wordlines or other wordlines unaffected. That is, unaffected so long as the magnitude of the current chosen in one wordline is insufficient to cause such switching by itself, but with the current magnitudes chosen to occur jointly in the two wordlines together being sufficient to do so. In other words, a coincidence of currents in an upper wordline 22 and a lower wordline 12 is required to provide a combined magnetic field sufficient to switch the edge magnetization in a bit structure 15, and such a coincidence of currents flowing adjacent of bit structure 15 is required to be unique to that bit structure for a single current occurring in one of upper wordlines 22 and a single current occurring in one of lower wordlines 12 if it is to be uniquely selected.

Figure 5A:
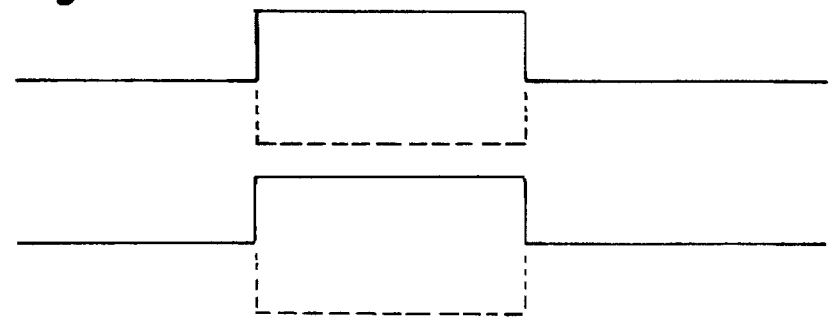
FIGS. 5A, 5B and 5C are graphs showing operating waveforms for a device embodying the present invention and a resistance characteristic of such a device.

Such a coincidence of currents being required to store information in a selected one of bit structures 15 will be sufficient to cause the desired switching of its edge magnetizations therein if current waveforms on the corresponding upper wordline 22, for corresponding wordline current $I_{22}$, and the corresponding lower wordline 12, for corresponding wordline current $I_{12}$, have the form shown in FIG. 5A assuming sufficient magnitudes for each. The solid waveforms for $I_{12}$ and $I_{22}$ in FIG. 5A give one polarity combination for the currents to result in the sum of the magnitudes of the magnetic fields due to each forcing the edge magnetizations in the memory films of the selected one of bit structures 15 to come to be oriented in one of the directions of extent along the longest dimension of that structure. The dashed line alternative current waveforms in FIG. 5A lead to currents flowing in a direction necessary for the magnetic field due to each to additively combine in the opposite direction to force the edge magnetizations to switch to lie in the opposite direction along the longest dimension of that bit structure.

A passivation layer, 23, is formed by chemical vapor deposition to a typical thickness of 5,000 to 10,000 Å using typically silicon nitride over wordlines 22. Prior to the formation of passivation layer 23, interconnections from the memory structure portion of the complete chip, including the sense line and the wordlines therein, shown in FIGS. 4A and 4B to the integrated circuits below in substrate 10 are also provided in conjunction with the provision of wordlines 22. However, such interconnections and the related operating circuitry in substrate 10 are not shown in FIGS. 4A and 4B because the added complexity would obscure that which is sought to be shown.

Although storing information in a selected one of bit structures 15 requires current coincidence in the corresponding, adjacent ones of upper wordlines 22 and lower wordlines 12 as described above, information retrieval from that bit structure must be achieved by current flowing in only one of those wordlines if the possibility of destruction of the stored information is to be avoided. Thus, retrieving information involves current flowing in only one of the wordlines, here chosen to be lower wordline 12, but with a relatively small sensing current also flowing in the sense line in which that bit structure 15 is connected as described above.

Figure 5B:
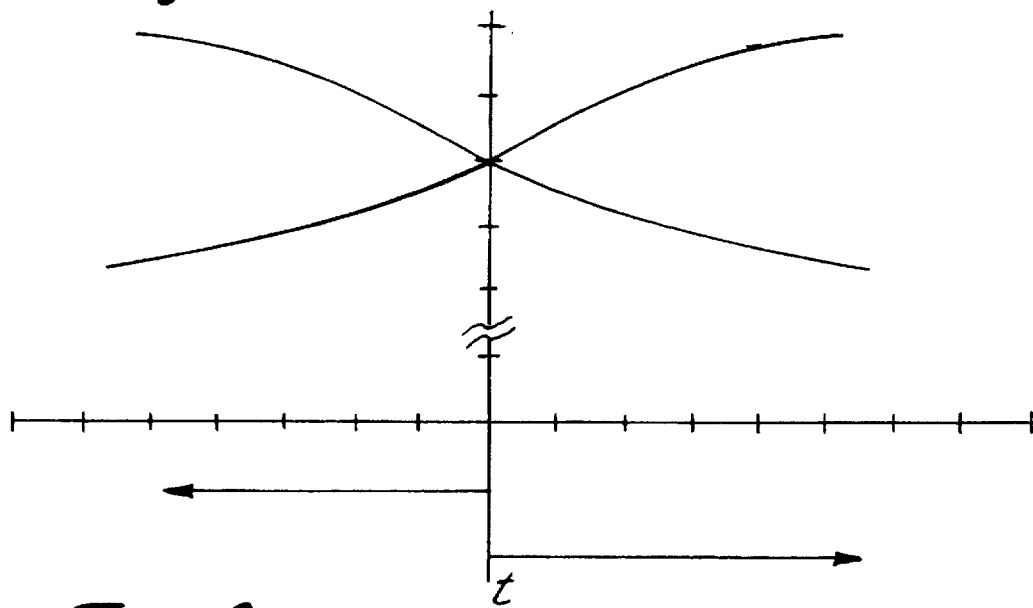

These currents must be arranged so as to retrieve the desired information in connection with the magnetoresistance characteristics of such a bit structure 15 as shown in FIG. 5B. There, the electrical resistance of the sense line is plotted against the magnetic field generated by current in the lower wordline 12 corresponding thereto. The resistance characteristics shown represent the resistance variation measured for the sense line due primarily to the magnetoresistive response of a bit structure 15 connected in series in that sense line, $R_{15-sense\ line}$, to the generation of a magnetic field, $H_{12}$, because of current flowing in its corresponding wordline 12. These resistance characteristics shown follow a $\sin^2\theta$ characteristic where $\theta$ represents the angle between the direction of the sense current flow and the average magnetization direction at any time in the selected bit structure 15.

That one of the characteristics shown in FIG. 5B beginning at the upper left for a negative magnetic field generated by wordline current, and from there falling in value with an increasingly more positive magnetic field, represents the situation in which the edge magnetization of the bit structure 15 in the sense line, selected by the corresponding wordline current $I_{12}$, is parallel to, and oriented in the same direction as, the initial negative field. The other resistance characteristic shown there represents the situation where the initial negative magnetic field due to the lower wordline current flow is in a direction opposite the edge magnetization of this selected one of bit structures 15 in the sense line. Such an initial magnetic field, $H_{AZ}$, shown as being negative in FIG. 5B, which results from a corresponding current being provided in the one of lower wordlines 12 associated with the selected one of bit structures 15 in the sense line, is established for purposes of "autozeroing" a sensing amplifier having an input connected to that sense line for purposes of the retrieval operation.

Figure 5C:
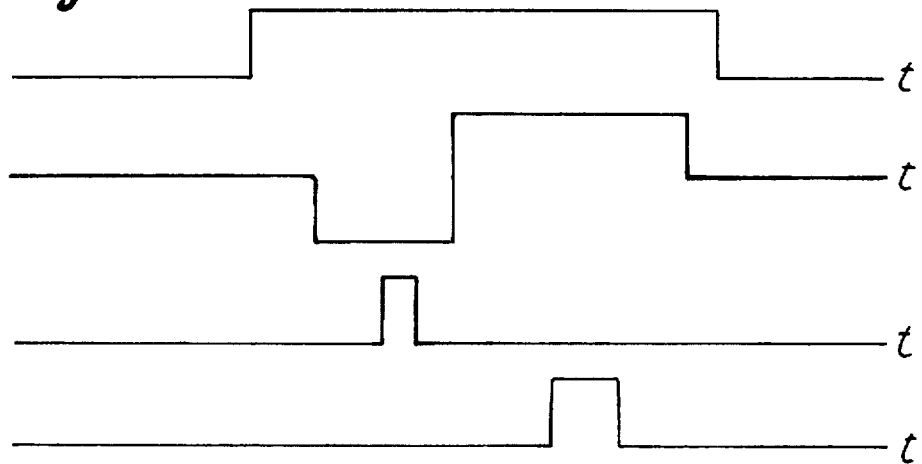

The currents and voltage pulse waveforms used in retrieving the information residing in a selected bit structure in a sense line versus time are shown in FIG. 5C. As shown in FIG. 5C, the sense current represented by $I_{15}$ is supplied through the sense line having the selected one of bit structures 15 therein from which information is to be retrieved, this sense current being supplied during the entire retrieval operation. Shortly after such a sense current is established, a negative word current $I_{12}$ is established in the one of lower wordlines 12 associated with the selected one of bit structures 15 in the sense line, this negative word current being taken as establishing the negative magnetic field $H_{AZ}$ shown in FIG. 5B for the "autozeroing" process to serve as an initial activation current.

In that process, the resistance value on sense line 15 after the establishment of negative magnetic field $H_{AZ}$ in the selected ones of bit structures 15 is used to set the sensing amplifier to have an initial zero value at its output when having one of its two inputs electrically connected for information retrieval purposes to the sense line containing the selected bit structure 15 in an array of such sense lines, and the other input to a reference circuit. This operation is the equivalent of setting the effective differential value of the sense amplifier to zero, and is done during the time the waveform designated AZ in FIG. 5C is shown with an increased value, i.e. during the pulse shown in that waveform.

Figure 6:
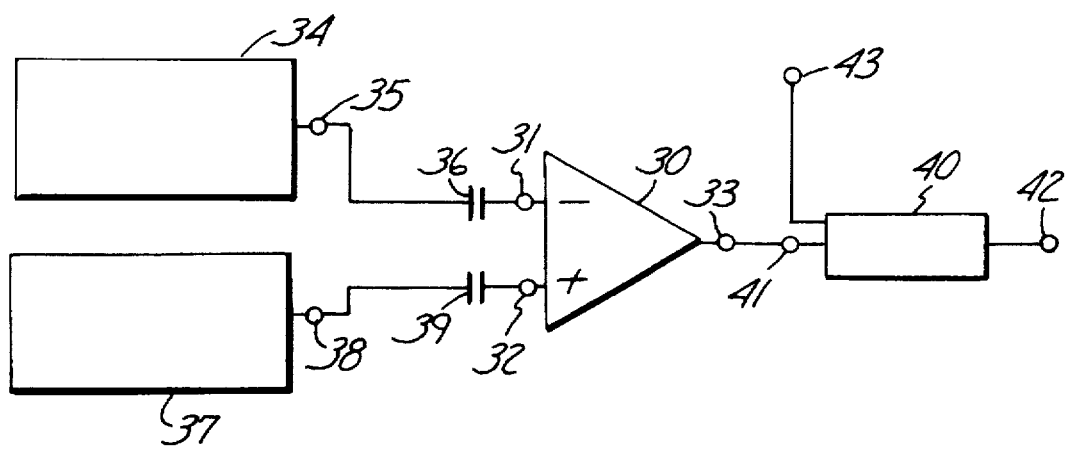
FIG. 6 shows a block and circuit schematic system diagram for use in practicing the present invention.

FIG. 6 shows a mixed block and circuit schematic diagram of those portions of a magnetoresistive memory system used in connection with such a retrieval arrangement as described above for retrieving information stored in that memory bit structure array, ordered by sense lines, having the selected bit structure 15 therein in its corresponding sense line. A differential sensing amplifier, 30, is shown having an inverting input, 31, a non-inverting input, 32, and an output, 33. An information storage array, 34, comprising bit structures 15 ordered in sense lines and associated switching circuitry has been connected at its information output, 35, through a capacitor, 36, and arbitrarily to inverting input 31 of sensing amplifier 30. Similarly, a reference arrangement, 37, and associated switching circuitry is connected at its output, 38, through a capacitor, 39, to non-inverting input 32 of sensing amplifier 30. Array 34 and arrangement 37 could be interchanged at the connections of the outputs thereof to the inputs of sensing amplifier 30. Reference arrangement 37 is typically formed of bit structures conducting currents matching sense currents which structures are ordered in reference sense lines generally like those in array 34 so they track one another over temperature. These reference sense lines have "dummy" information stored therein along with a dual element bit being used therein such that a reference value is provided at output 38 for forming a threshold value between a "0" voltage value and a "1" voltage value as a basis for providing the desired reference value. Switching between different ones of a plurality of reference sense lines may be used to avoid unwanted heating thereof because of otherwise carrying currents therein for a much larger fraction of time than sense currents occur in sense lines in array 34. A data latching means, 40, is connected at its output, 41, to output 33 of sensing amplifier 30. Latching arrangement 40 provides a data information bit at its output, 42, at the end of each information retrieval operation.

In an information retrieval operation, the address of a bit structure 15 containing information desired to be retrieved in array 34 is supplied to that array. The address is decoded to provide proper switching action in the array with respect to the bit structure 15 which is to have the information therein retrieved. Such switching action is based on switching arrangements to provide both corresponding sense line and wordline currents at the proper times as shown in FIG. 5C, and with the amplitudes and ordering in time required. A further switching operation will be provided to connect the output voltage of the sense line containing the selected information bit structure to output 35 of array 34 and the reference sense line output voltage to output 38 of arrangement 37. An example of the contents of array 34 is given in U.S. Pat. No. 4,829,476 incorporated herein above.

These output voltages switched to array output 35 of array 34 and arrangement output 38 of arrangement 37 will then be coupled through capacitors 36 and 39, respectively, to inputs 31 and 32, respectively, of differential sensing amplifier 30. Differential sensing amplifier 30 will, in effect, subtract the one voltage from the other, amplify the difference, and provide the result at output 33 thereof. If the result at output 33 of amplifier 30, representing either a "0" or a "1" information bit, is a voltage which exceeds the switching threshold of latch arrangement 40, as it will be for one of those states, latch arrangement 40 will provide the appropriate logic value at its output 42. If the other information state is represented by a voltage at output 33 of amplifier 30, that voltage will not exceed the switching threshold of latching arrangement 40, and the appropriate logic value will again be provided at output 42 of latching arrangement 40. These voltages supplied at output 33 of differential sensing amplifier 30 to input 41 of latch 40 will be given effect only when latch 40 is enabled to switch through the presence of a pulse in the sensing amplifier "strobing" signal SAS at "strobe" input, 43, of latch 40. Such an enabling signal allows transients in the output signal from output 33 of amplifier 30 to settle significantly before that signal is given effect at the input of latch 40.

As a first benefit, the presence of capacitors 36 and 39 avoids having uncompensated offsets between array 34 and arrangement 37 which would otherwise be presented at the inputs of amplifier 30. These offsets can be relatively large because of the inability to identically match information bit structures in a series string in array 34 forming a sense line with reference bit structures in a series string forming a reference sense line in arrangement 37, or with some other configurational alternative. The use of capacitors 36 and 39 in conjunction with switching circuitry in, and about, an amplification portion of amplifier 30 permits these capacitors to be charged to voltages to oppose such offsets, and any further offsets occurring in amplifier 30 with reference to its inputs 31 and 32 during the "autozeroing" operation portion of the information retrieval operation. Thus, in effect, the resistance value difference measured between a sense line containing the selected bit structure 15 in array 34 and a reference value in reference arrangement 37 will be given an effective zero difference at the value of the "autozeroing" magnetic field $H_{AZ}$ established to begin the retrieval operation in that bit structure. Such an arrangement gives a much better sensitivity for the very small signals provided by the selected information bit structure 15 through having the magnetic field provided for "autozeroing" purposes being terminated and followed by a retrieval magnetic field in the opposite direction being established as will be described below.

In effect, the resistance change sensed will be begun from either the minimum point on one of the characteristics in FIG. 5B or the maximum point of the opposite characteristic, depending on the information state stored in the selected one of bit structures 15, as established by the provision of the negative magnetic field $H_{AZ}$ for "autozeroing" purposes. The entire change from that point can be measured in the presence of the opposite direction magnetic field, the positive retrieval magnetic field $H_{RETR}$, supplied by changing the polarity of lower wordline current $I_{l2}$ after "autozeroing" as shown in FIG. 5C. This subsequently supplied positive magnetic field forces the resistance of the selected magnetic bit structure 15 to the opposite extremum along either characteristic from its initial extremum set by magnetic field $H_{AZ}$. Such a result provides a near maximum output signal obtainable from the memory films in the selected magnetic bit structure 15. The pulse appearing in sense amplifying "strobing" signal SAS during the provision of the positive magnetic retrieval field $H_{RETR}$ during the correspondingly shown positive current pulse in lower wordline current $I_{l2}$ in FIG. 5C "latches" the value at output 33 of amplifier 30 into latch 40. Thus, the change in resistance value resulting from the change in magnetic field from $-H_{AZ}$ to $H_{RETR}$ in the selected bit structure 15 that sets the voltage at output 33 of sensing amplifier 30 at the time that this positive magnetic field is supplied to that bit structure 15 supplies the desired information to amplifier 30 that then passes it to latch 40 at the occurrence of the pulse in signal SAS. An amplifying system suitable for differential sensing amplifier 30 to provide such "autozeroing" capabilities and subsequent resistance change measurement capabilities is disclosed in U.S. Pat. No. 4,829,476 incorporated above.

The structures shown in FIGS. 4A and 4B use pairs of wordlines, an upper wordline 22 and a lower wordline 12, with each bit structure 15 therein to select that bit structure for purposes of information storage by providing coincident currents thereat. Such an arrangement allows use of a quite small sense line current for retrieval purposes which is advantageous for the small dimension sense lines which result from densely packing bit structures over the upper surface of monolithic integrated circuit substrate 10. However, the extra fabrication steps required to provide a second wordline can be avoided if the sense line is composed of structures which can carry a more substantial current, and include therein bit structures which have edge magnetizations that are not entirely parallel to the direction of sense current therethrough as such magnetizations substantially are in the bit structures of FIGS. 4A and 4B.

Such a structural arrangement is shown in FIGS. 7A and 7B, where the bit structures 15 there are shown formed with those sides thereof, across which any sense current established therein flows, being formed at a 45° angle with respect both to (a) the direction of extent of the wordline retained with each (a "lower" wordline 12 shown crossing under and perpendicular to the direction of extent of the sense lines to be shown extending vertically in FIG. 7A), and (b) to the direction of extent of the sense lines (shown extending horizontally in FIG. 7A). Again in these figures, some features have been exaggerated with respect to others and certain structural features have been omitted for purposes of clarity. The structures shown in FIGS. 7A and 7B can be fabricated in much the same manner as the structures shown in FIGS. 4A and 4B, and similar structures, or structures for similar purposes, have been given the same numerical designations in FIGS. 7A and 7B that they had in FIGS. 4A and 4B.

The edge magnetizations in bit structures 15 will tend to be oriented more or less parallel with the relatively long diagonal sides of those structures because of demagnetization effects, and so will be generally oriented at an angle of approximately 45° to the directions of any currents occurring in either wordlines 12 or the sense lines formed by bit structures 15 and tungsten remnants 19. As a result, a coincidence of currents through both a sense line containing a bit structure 15 from which information retrieval is desired, and that wordline 12 therebelow, will result in characteristics similar to those shown in FIG. 5B. Thus, the retrieval can be made using waveforms much like those of FIG. 5C as will be further set out below. Of course, since only a fraction $1/\sqrt{2}$ of either the word current or the sense line current generates magnetic fields which are substantially parallel to the edge magnetizations of bit structures 15 (which, as indicated, are to a substantial degree parallel to the major diagonal of those structures), substantially larger currents are required for this retrieval operation.

Similarly, the operation for storing information can use waveforms much like those in FIG. 5A for the wordline current and the sense current to switch the edge magnetizations of such bit structures 15 in FIGS. 7A and 7B assuming they have similar dimensional extents in the major surfaces thereof as do the bit structures 15 shown in FIGS. 4A and 4B. The sense current for this purpose though must be much greater than that of the waveform shown in FIG. 5C to instead be on the order of the currents for the waveforms in FIG. 5A, and the currents of that figure must also be increased to take into account that only $1/\sqrt{2}$ either contributes to effective magnetic fields. Thus, somewhat more capable wordlines and sense lines are required in the structures of FIGS. 7A and 7B to enable them to carry such increased currents.

As indicated above, information retrievals are obtained by establishing substantial currents in selected ones of wordlines 12 coincidentally with much smaller currents in selected ones of those sense lines formed of bit structures 15 and tungsten remnants 19 as shown in FIGS. 7A and 7B. Once again, a sensing amplifier connected to any selected sense line from which a retrieval will be made is "autozeroed" using current in one direction in a wordline 12, and then the resistance change is measured in connection with reversing the direction of current through that wordline to provide a magnetic field in an opposite direction in the corresponding selected one of bit structures 15.

Hence, information storage using the edge magnetizations of bit structures 15 in FIGS. 7A and 7B can be accomplished in the arrangement shown there, as can information retrieval from those same bit structures, following much the same procedures as given for the structures of FIGS. 4A and 4B. Yet, the extra masking steps needed in fabricating monolithic integrated circuits containing the digital memory structures shown in FIGS. 7A and 7B for a second level of wordlines are eliminated.

In a further variation, additional masking steps can be used to add a storage film which is separated from the sense line and the bit structures therein, the latter becoming exclusively a sensing structure without a storage function. Such an arrangement permits choosing the parameters of the storage film optimally for storage purposes without the compromises required because of the storage element also being in the sensing line arrangement. That is, because the previously described structures have both the sensing and the storing occurring in the bit structures in the sense lines therein, bit structures will not easily be forced into being single domain structures until the size thereof becomes quite small in part because of interactions with other nearby bit structures. The use of supplemental storage films can result in the supplemental films being more easily formed as a single magnetic domain structure with just rotation switching involved excluding domain wall switching, or as an agglomeration of particulates having many magnetic domains therein and no easy axis so as to be effectively isotropic. The particulates in such supplemental films are square hysteresis loop iron oxide particulates with high coercive force.

FIGS. 8A and 8B show a structural arrangement of this latter type with added storage structures, 24, formed of such agglomerations of particles each provided under a corresponding one of bit structures 15, and each of similar dimensions in directions parallel to the edges of the major surfaces of its corresponding bit structure. Once more, some features in these figures have been exaggerated with respect to others and certain structural features have been omitted for purposes of clarity. Such agglomerations of iron oxide particulates can be provided in a subsequent masking step through a suitable deposition process. The remainder of the structure in FIGS. 8A and 8B can be provided using methods similar to those described above in providing the structures of FIGS. 4A and 4B.

Since storage structures 24 have no easy axis, the direction of magnetization therein can be set by magnetic fields generated by currents established in lower wordline 12 and upper wordline 22 using magnitude values therefor which are significantly less than those required to switch the edge magnetizations of bit structures 15. As a result then of limiting wordline current magnitudes to such values as reasonably necessary for changing the direction of magnetization in storage structures 24, the edge magnetizations of bit structures 15 never change during the storage of digital information. The only changes during such operations will thus be in the direction of magnetization of storage structures 24 to being oriented parallel to, and either in the direction of or the opposite direction of, the direction of edge magnetizations of the corresponding bit structures 15 which point one way or the other along the long sides thereof. Thus, the wordline currents for storing information in structures 24 are those of FIG. 5A but of smaller magnitudes.

Once either of the possible magnetization states of a storage structure 24 is established in such a structure, the resulting magnetic field therefrom will bias the corresponding bit structure 15. As a result, the magnetization of the interior portions of bit structure 15 will be forced to lie more closely parallel to the edge magnetizations thereof for one magnetization direction in structure 24, or more perpendicular to the edge magnetizations in the alternative magnetization state of structure 24. Such alternative magnetization states in storage structure 24 will through this biasing result in forcing the resistance value of the corresponding bit structure 15 toward one of two alternative extrema in the resistance characteristic thereof due to the magnetoresistive effect as can be seen in the characteristics shown in FIG. 9A.

Figure 9A:
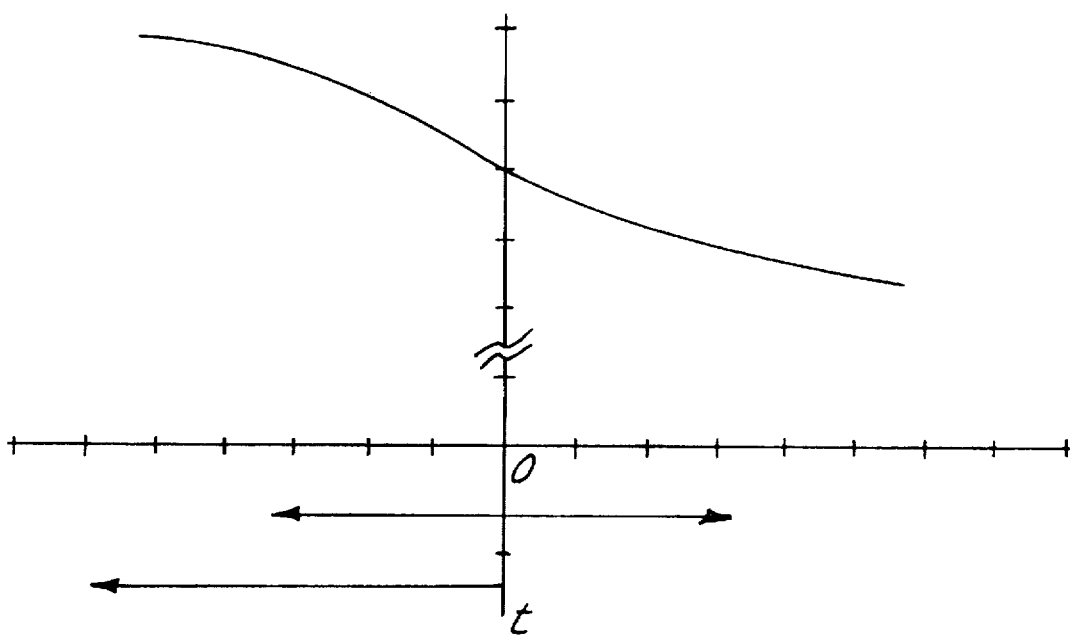
FIGS. 9A and 9B are graphs showing operating waveforms for a device embodying the present invention and a resistance characteristic of such a device.

That is, the resistance encountered in a bit structure 15 will be that resistance due to the presence of one or the other of the biasing magnetic fields established by structure 24, either $+H_{24}$ or $-H_{24}$, which will result in the occurrence of a value near one resistance extremum or the other with respect to the value that would be otherwise present in the absence of a biasing field provided by structure 24. The "autozeroing" of sensing amplifier 30 with sensing elements of the sort shown in FIGS. 9A and 9B in bit structure array 34 is done without introducing any additional word current into either of the wordlines, that is, the "autozeroing" is done at the bias point established by corresponding storage structure 24 either at negative magnetic field $-H_{24}$ or positive magnetic field $+H_{24}$. Hence, a zero autobiasing field is shown in FIG. 9A to mark the time point at which this "autozeroing" operation takes place, and is shown to occur before wordline current is established for a retrieval in one of the wordlines adjacent the bit structure to be selected, here chosen to be corresponding upper wordline 22.

Thereafter, a significant wordline current is provided in the upper wordline 22 corresponding to that bit structure 15 from which information retrieval is desired to establish a negative retrieval magnetic field, $H_{RETR}$, therein, and at some point during the application of this wordline current a "strobing" pulse is delivered to input 43 of latch 40 to store therein the information obtained by sensing amplifier 30 from the response of the selected bit structure 15 to application of $H_{RETR}$. If a negative bias field from storage structure 24 $-H_{24}$ was present, there will be relatively little change in the resistance of the selected magnetic bit structure 15, as can be seen in FIG. 9A, for a more negative magnetic field $-H_{RETR}$ to that bit structure from the already present negative magnetic field $-H_{24}$. On the other hand, if the initial bias point was due to a positive magnetic biasing field $+H_{24}$ because of the opposite magnetization state being stored in storage structure 24, the application of a negative retrieval field $-H_{RETR}$ will result in a substantial resistance increase detectable by differential amplifier 30. Hence, a significant output difference will occur from differential sensing amplifier 30 depending on which direction storage structure 24 was magnetized prior to the information retrieval operation. Of course, a positive retrieval field could alternatively be used giving an opposite magnitude direction in the resistance value from that just described.

Figure 9B:
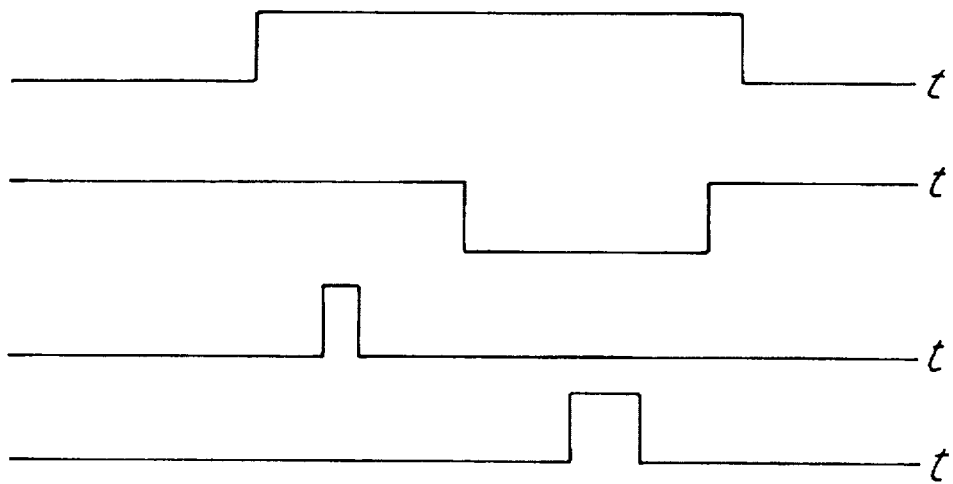

A structural rearrangement separating the storage structures from the sensing structures can be provided for the arrangement earlier shown in FIGS. 7A and 7B. The result is shown in FIGS. 10A and 10B where again similarly designated structures, or structures having similar purposes, have the same numerical designation as they did in FIGS. 7A and 7B. Characteristics similar to that shown in FIG. 9A would be exhibited by the resulting sense lines in the structures of FIGS. 10A and 10B, and operating procedures for storage of information in, and retrieval of information from, the structure of FIGS. 10A and 10B will be similar to those followed for the structure of FIGS. 8A and 8B as shown in FIG. 9B.

Structures 24 of FIGS. 8A and 8B, and of FIGS. 10A and 10B, are formed as indicated above of particle agglomerations and so have many magnetic domains therein. As a result, magnetization of these structures first in one direction and then in the opposite direction, or switching magnetic states therein, involves magnetic domain wall motion to result in new magnetization directions therein. Further, bit structures 15 in the magnetic memories of FIGS. 4A and 4B, and in FIGS. 7A and 7B, being connected in sense lines often have situations which result in multiple magnetic domains therein even though made relatively small (although at some sufficiently small area they will remain single domain memory films). However, single magnetic domain structures can switch using rotational switching in which the magnetization vector is merely rotated through the film between pointing in opposite directions along the easy axis of that film. Such rotational switching is accomplished using orthogonal magnetic fields, and can be faster than domain wall switching.

Some of the constraints in bit structures 15 leading to domain wall switching can be avoided by forming separate storage structures of ferromagnetic thin-films, such as was done in the structures of FIGS. 8A and 8B, and of FIGS. 10A and 10B. Such separate magnetic structures avoid interaction problems with neighboring structures such as occur in sense lines with the storage elements therein such as due to having the bit junctures therein being electrically connected to one another, and they carry no current so that size constraints to provide sufficient current carrying capability do not exist.

Figure 11A:
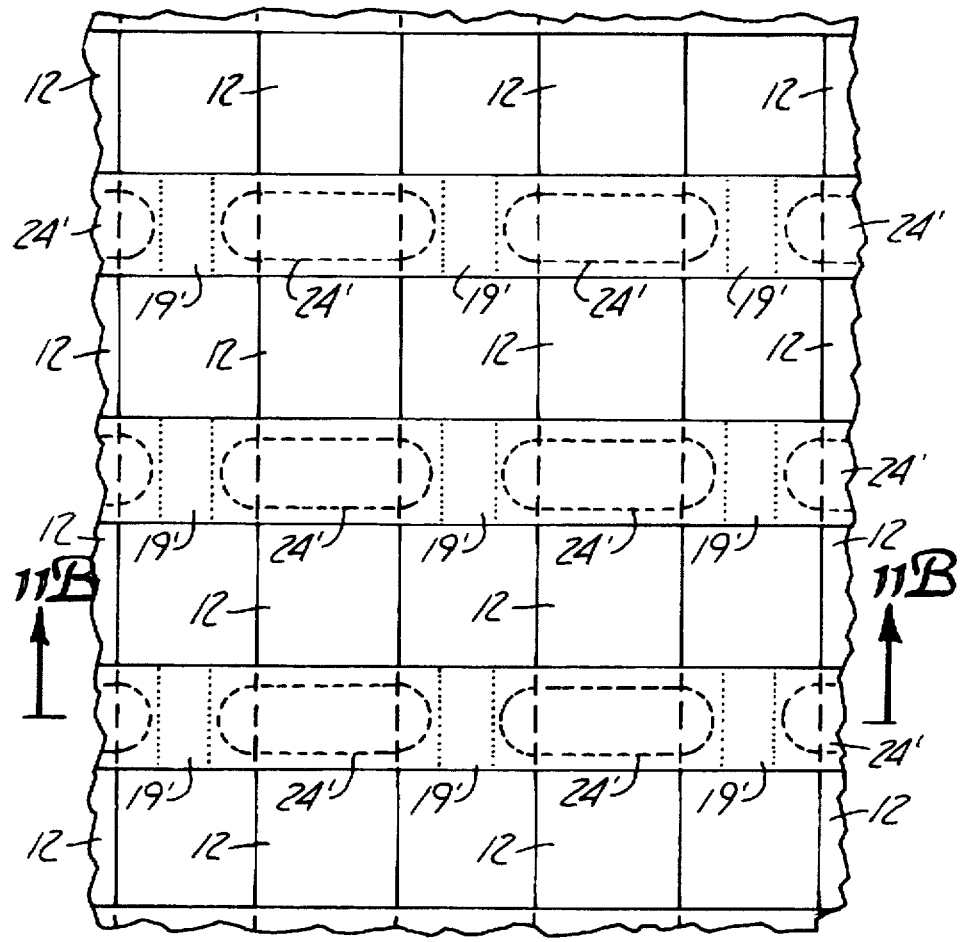
FIGS. 11A and 11B are diagrammatic representations of a portion of a device embodying the present invention.
Figure 11B:
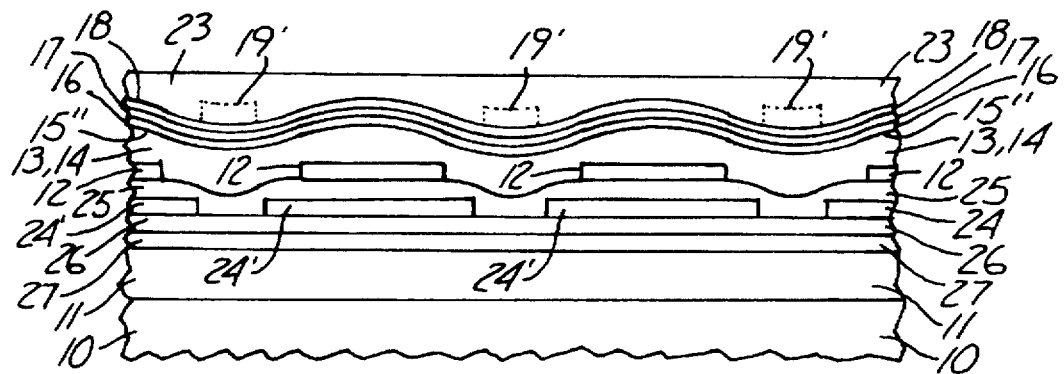

However, as indicated above, orthogonal magnetic fields must be provided to accomplish such rotational switching (and can accomplish domain wall switching if multiple domains appear in the ferromagnetic thin-film structures because of being insufficiently small or for other reasons such as due to the films interacting with other structural members in the environment thereof). A structure providing orthogonal magnetic fields and ferromagnetic thin-film storage structures is shown in FIGS. 11A and 11B. Again, in these figures, similar structures, or structures used for similar purposes, have been given the same numerical designations as they had in earlier figures. Also, exaggerations and omissions for purposes of clarity are present.

Once again, monolithic integrated circuit substrate 10 has a composite electrically insulating layer 11 thereon on which the memory structures are formed. Wordlines 12 are again provided as before, and a sense line is formed from continuous memory film layers 16 and 18 with a continuous intermediate layer 17 between them as before. However, this continuous structure is now designated 15" because of the use of a continuous set of bit structures therethrough in forming the continuous sense line without the offsets shown for previous sense lines. However, such a sense line with offsets could alternatively be provided in the structures of FIGS. 11A and 11B. An insulating layer supporting continuous bit structure sense line 15" has been redesignated 13,14 in FIG. 11B since it serves much the same function as the insulating layer having elevated surfaces and depressed surfaces in the earlier figures involving sense lines with bit structure offsets.

This continuity of sense line structure 15" can advantageously be somewhat broken up by the use of shorting bars between each portion thereof serving as a bit structure sensing the state of a storage structure therebelow. This can be accomplished by providing a tungsten shorting bar, 19', on memory film 18, these shorting bars being shown in dashed line form because of being alternatives not necessarily required for successful operation of the structure of FIGS. 11A and 11B. Passivation layer 23 is provided over continuous sense line 15" (or over nearly continuous sense line 15" with shorting bars 19' present).

Storage structure elements are provided beneath wordlines 12 of anisotropic ferromagnetic thin-film material again typically of 60% nickel, 20% cobalt and 20% iron, and typically formed a thickness of 100 to 200 Å. These structures have been redesignated 24' in FIGS. 11A and 11B because of the change of material, and because of the limitations on geometrical shape required for successful operation. That is, storage structures 24' are sputter deposited with a magnetic field present such that the easy axis induced therein by this field is directed into the plane of the paper of FIG. 11B, or vertically in FIG. 11A, just as are the easy axes for memory films 16 and 18 of the continuous or near continuous bit structures forming sense line 15". This allows manufacturing convenience in providing these materials in the same deposition chamber without having to break vacuum and without having to change the magnetic field situation in that chamber during fabrication.

However, for storage elements 24' to bias the edge magnetizations in sense line 15" of the corresponding portions serving as an adjacent bit structure, the effective easy axis of those storage elements must be parallel to the direction of extent of sense line 15". Thus, storage structures 24' are geometrically formed to be elongated parallel to the direction of extent of sense line 15" to thereby introduce shape anisotropy therein. As a result, the easy axis independently induced by depositing, in the presence of a magnetic field, the ferromagnetic material forming the thin-film portions serving as storage structures 24' is perpendicular to the easy axis set by the elongation of the geometrical shape of storage structures 24'. If the length to width ratios of the geometrical dimensions in the major surface of storage structures 24' are sufficiently large, the effective easy axis will very closely parallel the long dimension of those structures and the direction of extent of sense line 15" as desired.

An insulating layer of silicon nitride, 25, is formed over storage structures 24' as a base for providing wordlines 12 in the manner described above. Storage structures 24' are formed, however, on a further conductor, 26, herein termed a bit line. Bit line 26 and sense line 15" can each carry current in directions parallel to one another for purposes of switching the magnetization state in storage structures 24' in opposite directions along the effective easy axis thereof. This arrangement avoids having sense line 15" carry such switching current alone. Bit line 26 can again be formed of aluminum alloyed with 4% copper in a sputter deposition process.

Bit line 26 is formed, in turn, on a further magnetic thin-film formed of anisotropic, ferromagnetic material having a thickness of 100 to 300 Å. This ferromagnetic thin film structure is a "keeper" magnetic layer structure provided on the opposite side of wordlines 12 from sense line 15" to improve flux closure about those wordlines and to reduce magnetic interference between adjacent bit structures. This "keeper" layer, 27, is provided by sputter deposition onto the silicon nitride forming the upper strata of composite electrical insulating layer 11.

The storage of information in a bit structure portion of continuous or nearly continuous sense line 15" requires providing simultaneous currents in opposite directions through sense line 15" and bit line 26. Such opposite direction currents will result in additively combining much of the magnetic fields due thereto in storage structures 24' to rotate the magnetization therein toward being more or less parallel with wordlines 12. Then, a current through wordline 12 will determine which way the magnetization is rotated to set the final magnetization state in storage structure 24', either pointing in one direction or the other parallel to sense line 15". The direction of the current through wordline 12 will determine which of these magnetization states will result therein upon the termination of these various currents.

Retrieval of information stored in storage structure 24' follows the same pattern used in retrieving stored information in storage structures 24 shown in FIGS. 8A and 8B, and FIGS. 10A and 10B. That is, the resistance characteristic of portions of continuous or near continuous sense line structure 15" will be essentially as shown in FIG. 9A, and particularly so in the near continuous case resulting from the use of shorting bars 19'. Since the magnetization associated with either magnetization states of a storage structure 24' will bias an adjacent portion of continuous sense line 15" in the same manner as storage structures 24 biased bit structures 15 in the offset bit structures sense line of FIGS. 8B and 10B, the procedures for obtaining that information will follow those described in connection with FIGS. 9A and 9B.

Although the present invention has been described with reference to preferred embodiments, workers skilled in the art will recognize that changes may be made in form and detail without departing from the spirit and scope of the invention.

What is claimed is:

1. A ferromagnetic thin-film based digital memory using magnetoresistive sensing, said memory comprising:

a first state determination line structure having a first state determination line structure pair of end terminals adapted to conduct electrical current in at least one direction, said first state determination line structure end terminals having electrically connected in series therebetween a composite line structure with at least selected portions thereof having a structue comprising:

an intermediate layer of a kind of separating material, said intermediate layer having two major surfaces on oppossite sides thereof such that said major surfaces are separated by a separated by a separating layer thickness, and a memory film on each of said intermediate layer major surfaces with said memory film being of a magnetoresistive, anisotropic, ferromagnetic material, and a plurality of word line structures each having a pair of word line end terminals adapted to conduct electrical current in at least one direction with each of said pairs of word line end terminals having an electrical conductor electrically connected therebetween which is located across an electrical insulating layer from said memory film on one of said major surfaces of said intermediate layer at a corresponding one of said composite line structure selected portions, said composite line structure selected portions each having two of said plurality of word line structures as members of a corresponding pair of word line structures with parts of said corresponding electrical conductors in said members positioned relatively close to that said portion on opposite sides thereof such that an easy axis of said memory film therein is substantially parallel to a direction of flow of a substantial fraction of any currents through those said electrical conductor parts of either of said members of said corresponding pair of word line structures.

2. The memory of claim 1 wherein said separating layer thickness of said intermediate layer is less than 100 Å.

3. The memory of claim 1 wherein said memory film on said major surface of said intermediate layer has a thickness less than 200 Å.

4. The memory of claim 1 wherein said memory film on each of said major surfaces of said intermediate layer at each of said composite line structure selected portions is formed of first and second separate memory films each of which is on an opposite one of said intermediate layer major surfaces.

5. The memory of claim 4 wherein said easy axis of magnetization is substantially parallel in each of said first and second separate memory films in said composite line structure selected portions, and is substantially perpendicular in each of said first and second memory films to that path followed by said composite line structure in extending between said first state determination line structure end terminals.

6. The memory of claim 1 wherein said composite line structure selected portions of said first state determination line structure are each formed as one of a plurality of bit structures electrically connected in series between said first state determination line structure end terminals with each said bit structure electrically connected at a bit juncture to at least one other said bit structure such that each said bit structure has a structure comprising a said intermediate layer and a said memory film on each of said major surfaces of said intermediate layer.

7. The memory of claim 6 wherein said bit structures are electrically connected at a said bit juncture to at least one other bit structure such that adjacent said bit structures are offset from one another in a direction substantially perpendicular to that path followed by said composite line structure in extending between said first state determination line structure end terminals.

8. The memory of claim 7 wherein said offset extends a distance that is at least twice said separating layer thickness.

9. The memory of claim 6 wherein said memory film on each of said major surfaces of said intermediate layer is formed of first and second separate memory films each of which is on an opposite one of said intermediate layer major surfaces.

10. The memory of claim 9 wherein each of said first and second separate memory films has dimensions sufficiently small so as to have a single magnetic domain formed therein.

11. The memory of claim 6 wherein said easy axis of magnetization of said memory film in said bit structures is substantially perpendicular to that direction of extent of each said bit structure in extending to any said bit juncture electrically connected thereto.

12. The memory of claim 6 wherein said first state determination line structure and said plurality of word line structures are formed on a substrate having a semiconductor material integrated circuit portion therein.

13. The memory of claim 1 wherein said first state determination line structure and said plurality of word line structures are formed on a substrate having a semiconductor material integrated circuit portion therein.

14. A ferromagnetic thin-film based digital memory using magnetoresistive sensing, said memory comprising:

a first state determination line structure having a first state determination line structure pair of end terminals adapted to conduct electrical current in at least one-direction, said first state determination line structure end terminals having electrically connected in series therebetween a plurality of bit structures each with said bit structure electrically connected at an edge thereof through a bit juncture to at least one other said bit structure at an edge thereof such that said edges of adjacent said bit structures that are electrically connected to one another through a said bit juncture are each substantially parallel to an opposite edge of its bit structure and are each at angles therealong that are intermediate between being perpendicular to and parallel to that path followed by said first state determination line structure in extending between said first state determination line structure end terminals, said plurality of bit structures each having a structure comprising:

an intermediate layer of a kind of separating material, said intermediate layer having two major surfaces on opposite sides thereof such that said major surfaces are separated by a separating layer thickness, and a memory film on each of said intermediate layer major surfaces with said memory film being of a magnetoresistive, anisotropic, ferromagnetic material, and a plurality of word line structures each having a pair of word line end terminals adapted to conduct electrical current in at least one direction with each of said pairs of word line end terminals having an electrical conductor electrically connected therebetween which is located across an electrical insulating layer from said memory film on one of said major surfaces of said intermediate layer of a selected one os said bit structures.

15. The memory of claim 14 wherein said separating layer thickness of said intermediate layer is less than 100 Å.

16. The memory of claim 14 wherein said memory film on said major surfaces of said intermediate layer has a thickness less than 200 Å.

17. The memory of claim 14 wherein said memory film on each of said major surfaces of said intermediate layer is formed of first and second separate memory films each of which is on an opposite one of said intermediate layer major surfaces and each of which has an easy axis of magnetization.

18. The memory of claim 17 wherein each of said first and second separate memory films has dimensions sufficiently small so as to have a single magnetic domain formed therein.

19. The memory of claim 17 wherein said easy axis of magnetization is substantially parallel in each of said first and second separate memory films in said bit structures, and is substantially perpendicular in each of said first and second memory films to that path followed by said composite line structure in extending between said first state determination line structure end terminals.

20. The memory of claim 14 wherein said first state determination line structure and said plurality of word line structures are formed on a substrate having a semiconductor material integrated circuit portion therein.

21. The memory of claim 14 wherein said bit structures are electrically connected at a said bit juncture to at least one other bit structure such that adjacent said bit structures are offset from one another in a direction substantially perpendicular to that path followed by said first state determination line structure in extending between said first state determination line structure end terminals.

22. The memory of claim 21 wherein said offset extends a distance that is at least twice said separating layer thickness.

* * * * *

UNITED STATES PATENT AND TRADEMARK OFFICE
CERTIFICATE OF CORRECTION

PATENT NO. : 5,768,180

DATED : JUNE 16, 1998

INVENTOR(S) : ARTHUR V. POHM

It is certified that error appears in the above-identified patent and that said Letters Patent is hereby corrected as shown below:

Col. 3, line 34, after "oriented" insert --at--

Col. 7, line 30, delete "&", insert --a--

Col. 15, line 24 delete "1√2", insert --$1/\sqrt{2}$--

Col. 20, line 30, delete "by a separated"

Col. 22, Line 23, delete "os", insert --of--

Signed and Sealed this

Seventh Day of March, 2000

Attest:

Q. TODD DICKINSON

*Attesting Officer*   *Commissioner of Patents and Trademarks*